United States Patent [19]
Im et al.

[11] Patent Number: 5,691,624
[45] Date of Patent: Nov. 25, 1997

[54] METHOD AND APPARATUS FOR DETECTING A FULL-CHARGE CONDITION WHILE CHARGING A BATTERY

[75] Inventors: Sang-tae Im, Kyungki-do; Hwan-Ho Seoung, Seoul; Byung-Cho Choi, Inchun-Kwangyeoksi, all of Rep. of Korea

[73] Assignee: Samsung Electronics Co., Ltd., Suwon, Rep. of Korea

[21] Appl. No.: 639,098

[22] Filed: Apr. 24, 1996

[30] Foreign Application Priority Data

Apr. 24, 1995 [KR] Rep. of Korea .................. 95-9620

[51] Int. Cl.$^6$ .................. H01M 10/44; H01M 10/46; H01M 10/48
[52] U.S. Cl. .................. 320/48; 320/22; 320/23; 320/30; 320/32
[58] Field of Search .................. 320/20, 21, 22, 320/23, 30, 32, 33, 48

[56] References Cited

U.S. PATENT DOCUMENTS

| | | | |
|---|---|---|---|
| 4,855,663 | 8/1989 | Matsui et al. | 320/20 |
| 5,180,961 | 1/1993 | Tsujino | 320/20 |
| 5,196,780 | 3/1993 | Pacholok | 320/32 X |
| 5,345,162 | 9/1994 | Shiojima | 320/21 |

*Primary Examiner*—Peter S. Wong
*Assistant Examiner*—Patrick B. Law
*Attorney, Agent, or Firm*—Marger, Johnson, McCollom & Stolowitz, P.C.

[57] ABSTRACT

Secondary batteries, also called rechargeable batteries, are subject to damage from overcharging during rapid charging. A fully-charged condition of a battery undergoing recharging, for example a NiCd or NiMH battery, is detected by a signature drop in battery voltage called a negative delta voltage (NDV). Low-cost analog circuits and methods are disclosed for detecting the NDV. Op amp circuits are arranged to charge one capacitor while the battery voltage is rising to determine a peak voltage, and charge another capacitor while the battery voltage is falling below the peak voltage. The second capacitor voltage is compared to a reference voltage to determine when the battery voltage drop exceeds a predetermined NDV, indicating a fully-charged battery. The invention is useful in battery chargers, battery conditioners, and the like.

15 Claims, 2 Drawing Sheets

METHOD AND APPARATUS FOR DETECTING A FULL-CHARGE CONDITION WHILE CHARGING A BATTERY

FIELD OF THE INVENTION

The present invention relates to maintenance of secondary or rechargeable batteries such as the nickel cadmium (NiCd) and Nickel metal hydride (NiMH). More specifically, the present invention relates to accurate, yet inexpensive, methods of detecting when recharging of such batteries is completed for the purpose of avoiding overcharging.

BACKGROUND OF THE INVENTION

Rapid growth in recent years in the use of portable electronic equipment such as calculators, cellular phones, laptop computers and the like have increased the demand for rechargeable batteries and the need for improved performance from rechargeable batteries. Various battery chemistries are available today, each offering distinct advantages over the others, but none providing a fully satisfactory solution. Todays most common chemistries available include nickel cadmium (NiCd), nickel metal hydride (NiMH), sealed lead acid, lithium ion, lithium polymer and reusable alkaline. The NiCd and NiMH in particular are popular for applications such as cellular phones and laptop computers as they provide good loading characteristics. NiCd batteries are economically priced and relatively simple to use, while NiMH are more expensive, but provide higher energy capacity. NiMH has also been deemed environmentally friendly because of its low toxic metal contents. Both NiCD and NiMH batteries must be properly recharged in order to give good service and longevity. More specifically, it is important that charging be terminated as soon as possible after the battery has become fully charged, because overcharging can cause permanent damage to the cells. On the other hand, it is preferred that the battery be fully recharged so that it's full capacity is available.

For NiCd and NiMH batteries, rechargers are known that measure the charge state through temperature sensing. Temperature sensing is inaccurate, however, because of the wide tolerances of the sensing thermistor and its position in respect to the cells. Ambient temperatures and other factors come into play. To assure full charge under all conditions, charger manufacturers tend to overcharge the batteries. More advanced NiCd chargers use the "delta temperature" method for full-charge detection. Although still dependent on a thermistor, this type of charger is better for the batteries than those using absolute battery temperature.

Using more elaborate charger electronics, such as a microcontroller, more precise full-charge detection is achieved by monitoring the battery voltage and terminating the charge (or reducing it to a trickle charge rate) when a certain "voltage signature" occurs. One such signature is the negative delta V (NDV). The NDV method detects a full charge by a drop in the battery voltage. It must be measured with care since the voltage drop is relatively small, for example, on the order of 10–20 mV, yet the battery voltage can be noisy, depending on the quality of the recharging circuitry. A full-charge detection scheme therefore must be sensitive, but at the same time filter out noise on the battery voltage.

Battery charging equipment and analyzers are known to carry out these functions, but such systems are expensive because these functions are implemented by converting the battery voltage to a digital value with analog/digital converter circuits, and then using digital logic means such as a microcontroller for identifying the full-charge signature such as the NDV. An example of such a system is the Cadex C7000 battery analyzer, commercially available from Cadex Electronics, Inc. of Burnaby, British Columbia, Canada. The need remains, therefore, for accurately detecting full-charge condition when charging NiCd or NiMH batteries, while reducing the cost and complexity of detection equipment. Lower cost and miniaturization of full-charge detection circuitry could be used to provide compact, inexpensive recharging equipment that nonetheless provides proper care of rechargeable batteries so that the batteries, in turn, will provide good service and longevity.

SUMMARY OF THE INVENTION

An object of the present invention is to provide an inexpensive system for controlling recharging of a secondary battery.

Another object of the invention is to provide analog methods and apparatus so as to detect a full-charge signature of a battery without the need for complicated digital circuitry.

One aspect of the present invention is a circuit for detecting and indicating a full-charge condition of a rechargeable battery undergoing recharging. Full-charge condition is detected by a signature drop in battery voltage after the battery is charged to a peak voltage. In a preferred embodiment the new circuit includes a reference voltage circuit coupled to the battery to provide a reference voltage. The reference voltage circuit can include a plurality of series-connected diodes coupled to receive the battery voltage so that the resulting reference voltage is maintained at a predetermined increment below the battery voltage. A first capacitor is charged while the battery voltage is increasing, so that the first capacitor voltage provides an indication of the peak battery voltage achieved while the battery is charging.

A comparator is provided for comparing the reference voltage to a "monitoring voltage" so that the comparator provides an output signal (Vo) having a first state while the reference voltage (V1) is less than the monitoring voltage (V2) and a second state when the reference voltage (V1) exceeds the monitoring voltage (V2).

The monitoring voltage will fall below the reference voltage in response to the battery voltage exhibiting at least a predetermined negative delta voltage. (NDV) drop below the peak battery voltage. Thus the comparator output signal (Vo) changes state to indicate a full-charge condition of the battery.

In one illustrative embodiment, the circuitry for charging the first capacitor (C1) includes an op amp (Q1) having a non-inverting input coupled to the positive terminal of the battery (11) being recharged. A diode (D) is disposed between the output of the op amp (node V2) and an inverting input of the op amp, and is oriented so as to forward bias the diode when the op amp output voltage is higher than the inverting input voltage. In other words, capacitor C1 is charged through the diode when the op amp output is high. A resistor (R) is provided between the op amp inverting input and the capacitor (C1), while the capacitor is disposed between the resistor and a the negative terminal of the battery. A second capacitor (C2) is arranged in parallel with the diode, so that the first capacitor (C1) discharges through the resistor and through the second capacitor (C2) when the battery voltage is falling. When the battery voltage is falling, the diode is turned off. The voltage across the capacitor C2 is given by $(C1/C2)(-\Delta V_{batt})$ where $\Delta V_{batt}$ is the battery voltage drop below the peak voltage.

DETAILED DESCRIPTION OF THE PREFERRED EMBODIMENT

Figure 1:
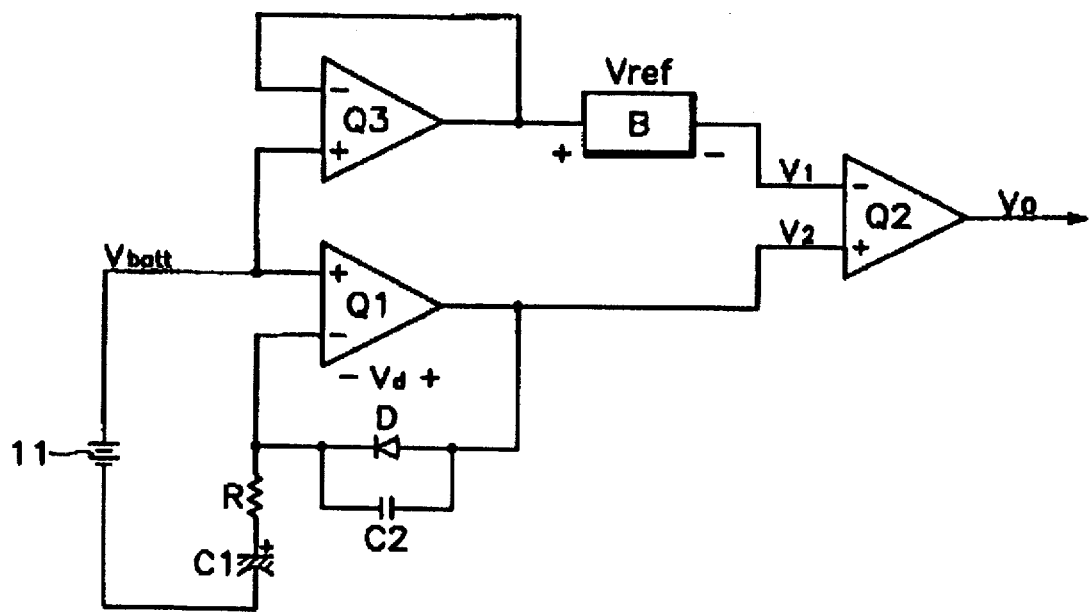
FIG. 1 is a schematic diagram for detecting a negative delta voltage (NDV) drop in battery voltage according to the present invention.
Figure 3:
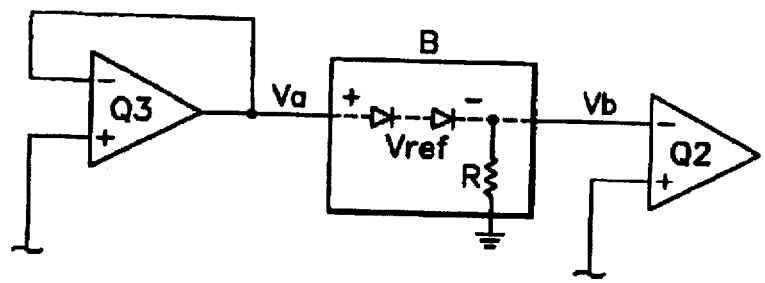
FIG. 3 is a schematic diagram illustrating one embodiment of the reference voltage block B of FIG. 1.

Referring to FIG. 1, a rechargeable battery 11 receives recharging current applied to the positive terminal of the battery by a recharging power supply (not shown). The positive terminal of battery 11 is coupled to the noninverting (+) input terminal of a first operational amplifier (hereinafter "op amp") Q3. The inverting (−) input of op amp Q3 is tied to the output terminal of op amp Q3 so that the op amp Q3 forms a voltage follower configuration. The output voltage of op amp Q3 will reflect the battery voltage (Vbatt). The output of op amp Q3 also is connected to block "B" which provides a predetermined voltage drop "Vref". Accordingly, the output of block B, labeled V1 in the Figure, will exhibit a voltage equal to (Vbatt−Vref). Block B may comprise, for example, one or more diodes arranged in series to provide the desired voltage drop. FIG. 3 is a schematic diagram showing one embodiment of block B. In FIG. 3, block B comprises first and second diodes, coupled in series, together with a pull-down resistor at the output side of the circuit.

Referring again to FIG. 1, the output of block B is coupled to the inverting (−) input of a second op amp or comparator circuit Q2. The output of comparator Q2 provides an output signal Vo that changes state when the battery 11 reaches a full-charge condition as more fully explained later.

The positive terminal of battery 11 also is coupled to the noninverting (+) input of a third op amp Q1. The output of op amp Q1 is coupled to the noninverting input of the comparator Q2. The voltage at that node is indicated as V2. A diode D is coupled from the output of op amp Q1 (node V2) back to the inverting input. A capacitor C2 also is coupled from the output of op amp Q1 back to the inverting input so that capacitor C2 is arranged in parallel with diode D. Finally, a resistor R and a capacitor C1 are arranged in series from the inverting input of op amp Q1 to the negative terminal of battery 11. Other details of the circuit of FIG. 1, such as op amp power connections, are omitted for clarity but will be apparent to those skilled in the art in view of this disclosure.

Operation of the circuit of FIG. 1 is described next. The purpose of the circuit of FIG. 1, as noted above, is to determine when the battery 11 is fully-charged, by detecting a negative delta voltage, i.e., a battery voltage drop below the maximum or peak voltage achieved while charging. During charging, the battery voltage Vbatt is increasing, and the output of op amp Q1 is pulled up, so that it is equals (Vbatt+Vdiode). Since the diode D is turned ON, it shunts current around C2, and provides charging current to C1 through resistor R.

Figure 2:
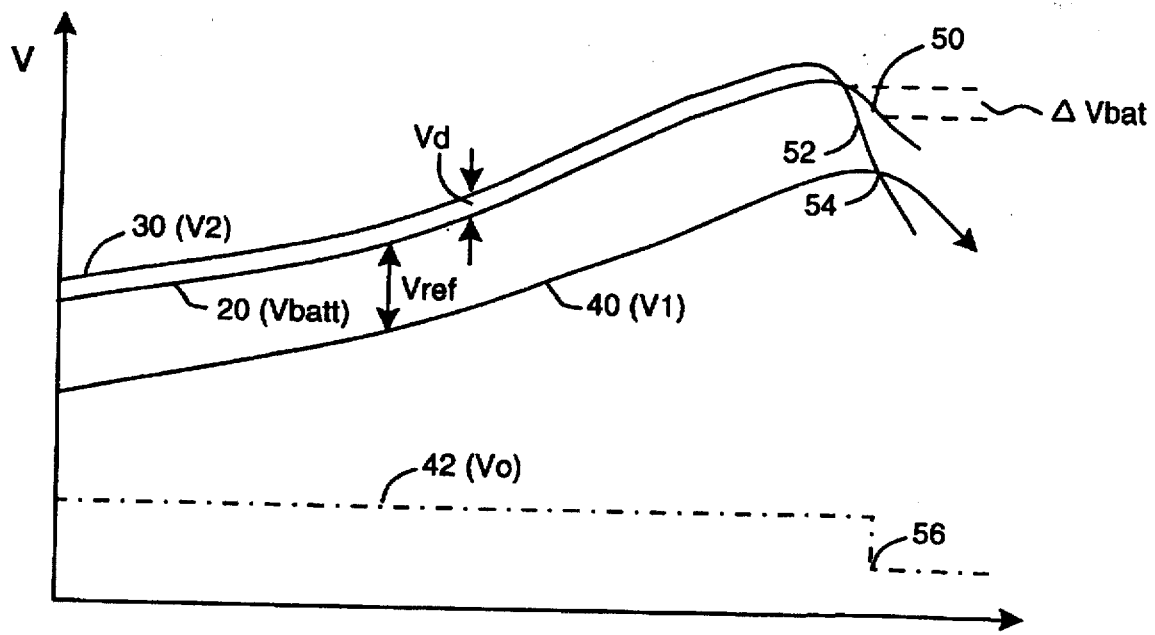
FIG. 2 is a voltage waveform plot illustrating operation of the circuit of FIG. 1.

The voltage on C2 is limited to one diode drop (or about 0.7 vdc). The output of op amp Q3 follows the battery voltage Vbatt, as noted earlier. Referring now to FIG. 2, the battery is charging in the left portion of the Figure, where the battery voltage Vbatt is indicated at reference 20. The battery voltage may be, for example, on the order of 5 or 10 volts, although the battery voltage is not important as long as it exceeds a predetermined minimum value, for example 2 volts, sufficient to ensure proper operation of the circuit of FIG. 1. Voltage V2, indicated at reference 30, follows the battery voltage Vbatt plus an increment Vd, which is the voltage across the diode D. The voltage V1, which appears at the inverting input to comparator Q2, is indicated in the voltage plot of FIG. 2 at reference 40. It may be observed that voltage V1 follows the battery voltage, offset below it by the voltage drop Vref provided by block B in FIG. 1. As the battery charges, C1 is charged up to a voltage level approximately equal to the battery voltage. While C1 is charging, it has a charging current $i_{c1}$ equal to C1 (dVbatt/dt), where C1 is the capacitance of the capacitor C1 and Vbatt is the voltage of the battery 11.

After the battery is fully charged, the voltage Vbatt sags. Accordingly, dVbatt/dt becomes negative, and the charge on capacitor C1 is discharged through the resistor R and capacitor C2. Diode D is turned OFF. While capacitor C1 is discharging through resistor R and capacitor C2 is charging, the voltage VC2 across capacitor $C_2$ is equal to:

$$(1/C_2)(\int i_{c1} dt) = (1/C_2)(\int C_1 (dVbatt/dt) dt) = (C_1/C_2)(-\Delta Vbatt)$$

where $C_2$ is the capacitance of capacitor C2 and −ΔVbatt is the battery voltage drop below its maximum value. In other words, V2 will fall while Vbatt is falling, effectively multiplied by a gain factor equal to C1/C2.

Referring to FIG. 2, it shows Vbatt falling at reference 50 with the corresponding drop in V2 indicated at reference 52. Since the gain factor is determined by a ratio of capacitors C1/C2, it can be determined very accurately, while using relatively small capacitors so as to minimize area in an integrated circuit implementation.

Voltages V1 and V2 are compared by the comparator Q2. During charging, V1 is well below V2 since block B reduces voltage V1 well below the battery voltage. Since the noninverting input voltage V2 is higher than V1, the output Vo of comparator Q2 is high, as indicated at reference 42 in FIG. 2. When the battery voltage falls as indicated at 50, voltage V2 falls much faster, by the gain factor mentioned above, as indicated at reference 52 in FIG. 2. V2 and V1 cross at 54 of FIG. 2. Since V2 is now below V1, the output Vo of comparator Q2 falls to a low state as indicated at 56 in FIG. 2. Accordingly, this output signal Vo can be used to stop charging the battery or reduce the charge to a trickle level. Thus, it can be seen that the circuit will operate as intended for a given application by appropriate selection of the component values C1, C2 and Vref, with due regard to the negative delta voltage NDV signature of the battery. In addition, the circuit of FIG. 1 will not prematurely terminate charging as a result of noise on the battery voltage. When the battery voltage makes a brief negative excursion due to a noise spike, the filtering effect of C1, R and C2 in combination will prevent the voltage V2 from falling so quickly as to change the state of the output comparator Q2. Again, selection of particular component values for a given application will require only routine engineering in view of this disclosure.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

We claim:

1. A circuit for detecting and indicating a full-charge condition of a rechargeable battery undergoing recharging while coupled to the circuit, the circuit comprising:

a reference voltage means coupled to the battery to provide a reference voltage (V1);

means (C1) responsive to a voltage produced by the battery for providing an indication of a maximum battery voltage achieved while the battery is charging;

a comparator having a first input coupled to the reference voltage means for comparing the reference voltage (V1) to a monitoring voltage (V2) presented to a second input of the comparator such that the comparator provides an output signal (Vo) having a first state while the reference voltage (V1) is less than the monitoring voltage (V2) and a second state when the reference voltage (V1) exceeds the monitoring voltage (V2);

means for providing the monitoring voltage (V2) responsive to the battery voltage such that the monitoring voltage (V2) falls below the reference voltage (V1) in response to the battery voltage exhibiting at least a predetermined drop (NDV) below the maximum battery voltage, whereby the comparator output signal (Vo) changes state to indicate a full-charge condition of the battery.

2. A circuit according to claim 1 wherein the reference voltage means includes a plurality of series-connected diodes.

3. A circuit according to claim 1 wherein the means responsive to the battery voltage for providing an indication of a maximum battery voltage achieved while the battery is charging includes a first capacitor (C1) and means for charging the first capacitor while the battery voltage is rising.

4. A circuit according to claim 3 wherein the means for charging the first capacitor (C1) includes:

an op amp (Q1) having a non-inverting input coupled to a positive terminal of the battery (11);

a diode (D) disposed between the output of the op amp (V2) and an inverting input of the op amp, and arranged so as to forward bias the diode when the op amp output voltage is higher than the inverting input voltage; and a resistor (R) disposed between the op amp inverting input and the first capacitor (C1); and wherein the capacitor is disposed between the resistor and a negative terminal of the battery.

5. A circuit according to claim 3 wherein the reference voltage means includes a first op amp coupled to the battery in a voltage-follower configuration so that the first op amp output voltage tracks the battery voltage, and means for reducing the first op amp output voltage by a predetermined voltage drop to produce the reference voltage (V1).

6. A circuit according to claim 3 wherein the means for providing the monitoring voltage (V2) responsive to the battery voltage includes a second capacitor (C2) arranged in parallel with the diode, so that the first capacitor (C1) discharges through the resistor and through the second capacitor (C2) when the battery voltage is falling.

7. A circuit for detecting and indicating a full-charge condition of a rechargeable battery undergoing recharging while coupled to the circuit, the circuit comprising:

a reference voltage means coupled to the battery to provide a reference voltage (V1);

first and second capacitors (C1,C2);

means for charging the first capacitor while a voltage produced by the battery is rising, so as to provide an indication of a maximum battery voltage achieved while the battery is charging;

means for charging the second capacitor while the battery voltage is falling below the indicated maximum battery voltage, thereby developing a voltage across the second capacitor responsive to a negative delta voltage (NDV) drop of the battery voltage, said negative delta voltage being indicative of a full-charge condition of the battery;

and means for comparing a voltage developed across the second capacitor to the reference voltage so as to provide an output signal (Vo) that changes state to indicate the full-charge condition of the battery.

8. A circuit according to claim 7 wherein the reference voltage means includes a first op amp coupled to the battery in a voltage-follower configuration.

9. A circuit according to claim 7 wherein the means for charging the first capacitor while the battery voltage is rising includes:

an op amp (Q1) having a non-inverting input coupled to a positive terminal of the battery (11);

a diode (D) disposed between the output of the op amp (V2) and an inverting input of the op amp, and arranged so as to forward bias the diode when the op amp output voltage is higher than the inverting input voltage; and a resistor (R) disposed between the op amp inverting input and the capacitor (C1); and wherein the capacitor is disposed between the resistor and a negative terminal of the battery.

10. A circuit according to claim 9 wherein said means for charging the second capacitor while the battery voltage is falling below the indicated maximum battery voltage includes said op amp (Q1), the second capacitor being arranged in parallel with the said diode so that the first capacitor (C1) discharges through the resistor and through the second capacitor (C2) when the battery voltage is falling.

11. A method of detecting a full-charge condition of a rechargeable battery undergoing recharging, comprising the steps of:

charging a first capacitor while a voltage produced by the battery is rising so as to develop a charge on the first capacitor indicative of a peak battery voltage achieved while the battery is charging;

if the battery voltage falls below the peak battery voltage, discharging the first capacitor through a second capacitor thereby charging the second capacitor as long as the battery voltage is below the peak battery voltage;

monitoring a voltage developing across the second capacitor while it is charging so as to monitor a negative delta voltage (NDV) amount by which the battery voltage has fallen below the peak battery voltage; and if the amount by which the battery voltage has fallen below the peak battery voltage exceeds a predetermined NDV value, providing an indication that a full-charge condition of the battery is detected.

12. A method according to claim 11 further comprising filtering relatively brief excursions of the battery voltage below the peak battery voltage so that said relatively brief excursions of the battery voltage do not result in a false indication of a full-charge condition of the battery.

13. A method according to claim 12 wherein said filtering step includes providing as series resistor between the first and second capacitors.

14. A method according to claim 12 wherein said charging the first capacitor (C1) includes:

providing op amp (Q1) having a non-inverting input coupled to a positive terminal of the battery (11);

arranging a diode (D) between the output of the op amp (V2) and an inverting input of the op amp;

connecting the first capacitor between the said inverting input and a negative terminal of the battery; and forward biasing the diode when the op amp output voltage is higher than the inverting input voltage, thereby providing a current path through the diode for charging the first capacitor.

15. A method according to claim 12 further comprising limiting current flow through the capacitor (C1) for filming brief excursions of the battery voltage below the peak battery voltage.

* * * * *

UNITED STATES PATENT AND TRADEMARK OFFICE
CERTIFICATE OF CORRECTION

PATENT NO.   : 5,691,624
DATED        : November 25, 1997
INVENTOR(S)  : Im et al.

It is certified that error appears in the above-identified patent and that said Letters Patent is hereby corrected as shown below:

Column 8,
Line 4, "filming" should read -- filtering --.

Signed and Sealed this

Eleventh Day of February, 2003

JAMES E. ROGAN
*Director of the United States Patent and Trademark Office*